(12) United States Patent
Chen et al.

(10) Patent No.: US 12,439,704 B2
(45) Date of Patent: Oct. 7, 2025

(54) PHOTOVOLTAIC MODULE, BACK SHEET OF PHOTOVOLTAIC MODULE AND MANUFACTURING METHOD OF PHOTOVOLTAIC MODULE

(71) Applicant: JINGAO SOLAR CO., LTD., Hebei (CN)

(72) Inventors: Daoyuan Chen, Jiangsu (CN); Wenjuan Xue, Jiangsu (CN); Yanfang Zhou, Jiangsu (CN); Shuang Zhao, Jiangsu (CN); Jian Li, Jiangsu (CN)

(73) Assignee: Jingao Solar Co., Ltd., Hebei (CN)

( * ) Notice: Subject to any disclaimer, the term of this patent is extended or adjusted under 35 U.S.C. 154(b) by 173 days.

(21) Appl. No.: 17/614,310

(22) PCT Filed: Aug. 28, 2020

(86) PCT No.: PCT/CN2020/112082
§ 371 (c)(1),
(2) Date: Nov. 24, 2021

(87) PCT Pub. No.: WO2022/016662
PCT Pub. Date: Jan. 27, 2022

(65) Prior Publication Data
US 2022/0320356 A1    Oct. 6, 2022

(30) Foreign Application Priority Data

Jul. 22, 2020 (CN) .......................... 202010712100.2
Aug. 14, 2020 (CN) .......................... 202010818096.8
Aug. 14, 2020 (CN) .......................... 202010818105.3

(51) Int. Cl.
*H10F 77/63* (2025.01)
*H10F 19/31* (2025.01)
(Continued)

(52) U.S. Cl.
CPC ............. *H10F 19/85* (2025.01); *H10F 19/31* (2025.01); *H10F 71/00* (2025.01); *H10F 77/63* (2025.01); *Y02E 10/50* (2013.01)

(58) Field of Classification Search
CPC ..... H01L 31/049; H01L 31/052; H10F 19/85; H10F 19/31; H10F 71/00; H10F 77/63
See application file for complete search history.

(56) References Cited

U.S. PATENT DOCUMENTS

| | | | |
|---|---|---|---|
| 7,985,919 B1 * | 7/2011 | Roscheisen | ............. H02S 40/36 136/246 |
| 2011/0017265 A1 | 1/2011 | Farrell et al. | |

(Continued)

FOREIGN PATENT DOCUMENTS

| CN | 102569454 A | 7/2012 |
|---|---|---|
| CN | 202772157 U * | 3/2013 |

(Continued)

OTHER PUBLICATIONS

English Machine Translation of CN 202772157 (Year: 2013).*
English Machine Translation of CN109065653A (Year: 2018).*

*Primary Examiner* — Kourtney R S Carlson
(74) *Attorney, Agent, or Firm* — Volpe Koenig

(57) ABSTRACT

At least some embodiments of the present disclosure provide a back sheet of a photovoltaic module, a photovoltaic modules and a manufacturing method thereof. The photovoltaic module includes: a plurality of battery cells arranged in an array and configured to receive light and generate power; and a thermally conductive layer in a mesh shape, including a skeleton section and a hollow section surrounded by the skeleton section. In the thickness direction of the photovoltaic module, at least a part of the skeleton section overlaps with a gap between adjacent battery cells, and the hollow section overlaps with the battery cell. The photovoltaic module can conduct the heat at the hot spot of the (Continued)

photovoltaic module in time while ensuring the power generation efficiency of the photovoltaic module, thus improving the stability of the photovoltaic module.

4 Claims, 11 Drawing Sheets

(51) Int. Cl.
*H10F 19/85* (2025.01)
*H10F 71/00* (2025.01)

(56) References Cited

U.S. PATENT DOCUMENTS

| | | | |
|---|---|---|---|
| 2011/0265871 A1 | 11/2011 | Lamarche | |
| 2012/0325306 A1* | 12/2012 | Auman | H01L 31/049 428/324 |
| 2014/0102515 A1* | 4/2014 | Sakuma | H01L 31/0508 136/246 |
| 2016/0359447 A1* | 12/2016 | Hund | H02S 40/32 |
| 2017/0099027 A1* | 4/2017 | Park | H02S 30/10 |
| 2018/0013025 A1* | 1/2018 | Iwata | H01L 31/0547 |
| 2019/0237603 A1* | 8/2019 | O'Neill | C09J 7/35 |

FOREIGN PATENT DOCUMENTS

| | | | | |
|---|---|---|---|---|
| CN | 202888215 U | | 4/2013 | |
| CN | 104231701 A | | 12/2014 | |
| CN | 105047745 A | | 11/2015 | |
| CN | 106713189 A | | 5/2017 | |
| CN | 106793068 A | | 5/2017 | |
| CN | 106935674 A | | 7/2017 | |
| CN | 107611109 A | | 1/2018 | |
| CN | 207183291 U | | 4/2018 | |
| CN | 109065653 A | * | 12/2018 | ........... B32B 27/304 |
| CN | 211743167 U | | 10/2020 | |
| JP | 2017-221007 A | | 12/2017 | |
| WO | 2012/050316 A1 | | 4/2012 | |
| WO | 2013125877 A1 | | 8/2013 | |
| WO | WO-2015200721 A1 | * | 12/2015 | ............. B32B 15/18 |

* cited by examiner

PHOTOVOLTAIC MODULE, BACK SHEET OF PHOTOVOLTAIC MODULE AND MANUFACTURING METHOD OF PHOTOVOLTAIC MODULE

The present application claims priority of the Chinese Patent Application No. 202010712100.2 filed on Jul. 22, 2020 and entitled "Photovoltaic Module, Backplane of Photovoltaic Module and Manufacturing Method of Photovoltaic Module", the Chinese Patent Application No. 202010818096.8 filed on Aug. 14, 2020 and entitled "Photovoltaic Module, Backplane of Photovoltaic Module and Manufacturing Method of Photovoltaic Module", and the Chinese Patent Application No. 202010818105.3 filed on Aug. 14, 2020 and entitled "Manufacturing Method of Photovoltaic Module", the disclosures of which are incorporated herein by reference in their entirety as part of the present application.

TECHNICAL FIELD

The present disclosure relates to a photovoltaic module, a back sheet of a photovoltaic module and a manufacturing method of a photovoltaic module.

BACKGROUND

The hot spot effect of a photovoltaic module refers to the phenomenon that under certain conditions, the shielded battery cells in the series branch serve as a load, consuming the energy generated by other illuminated battery cells, and the shielded battery cells will heat up. The hot spot temperature can reach above 170 Celsius degrees.

The hot spot effect of the photovoltaic module will cause great harm. The shielded battery cells will consume part or all of the energy generated by the illuminated battery cells to generate heat, which will reduce the output power, and seriously, may permanently damage the battery cells or even burn the battery cells. Therefore, reducing the hot spot temperature of the photovoltaic module is an urgent problem to be solved.

SUMMARY

An aspect of the present disclosure provides a photovoltaic module, which includes a battery layer and a thermally conductive layer. The battery layer includes a plurality of battery cells, and the plurality of battery cells are arranged in an array and configured to receive light and generate power. The thermally conductive layer is formed of or contains a thermally conductive material, and is in thermal communication with the battery layer. The thermally conductive layer is in a mesh shape and includes a skeleton section and a hollow section surrounded by the skeleton section. In a thickness direction of the photovoltaic module, at least a part of the skeleton section overlaps with a gap between adjacent battery cells, and the hollow section overlaps with the plurality of battery cells.

Another aspect of the present disclosure provides a back sheet of a photovoltaic module, which includes a thermally conductive layer. The thermally conductive layer is in a mesh shape and includes a skeleton section and a hollow section surrounded by the skeleton section.

Another aspect of the present disclosure provides a manufacturing method of a photovoltaic module, which includes: providing a transparent front sheet; providing a back sheet; providing a thermally conductive layer, wherein the thermally conductive layer is in a mesh shape and includes a skeleton section and a hollow section surrounded by the skeleton section; and providing a battery layer, which includes a plurality of battery cells, between the front sheet and the back sheet, wherein the plurality of battery cells are arranged in an array, so that in a thickness direction of the photovoltaic module, at least a part of the skeleton section overlaps with a gap between adjacent battery cells, and the hollow section overlaps with plurality of battery cells.

DETAILED DESCRIPTION

The photovoltaic module is usually plate-like or sheet-like, which substantially extend in a plane and have a certain thickness. In order to describe the photovoltaic module according to the present disclosure conveniently and clearly, the direction perpendicular to the plane in which the photovoltaic module extends is defined as the "thickness direction". In this specification, the "thermal communication" or "thermal connection" relationship between one component and another component includes not only the heat transfer relationship formed by the contact between the one component and the another component, but also the case in which an intermediate component is arranged between the one component and the another component and the heat of the one component is transferred to the another component. And the heat transfer includes not only heat conduction, but also heat radiation, heat convection, etc.

Figure 26:
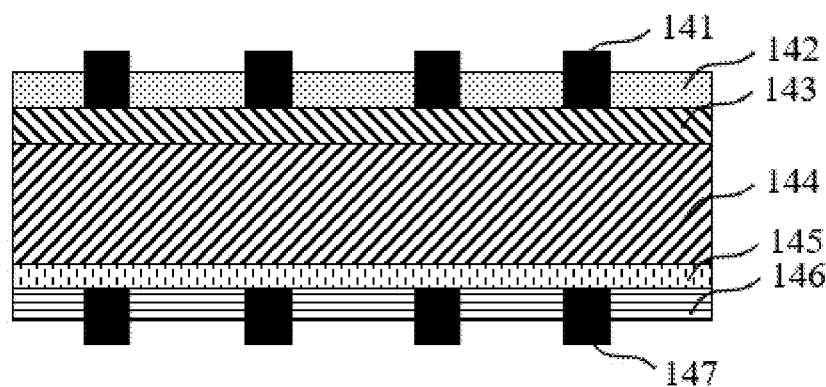
FIG. 26 shows a cross-sectional view of a double-sided battery cell.

The photovoltaic module generally includes a back sheet and a battery layer disposed on the back sheet. In the battery layer, a plurality of battery cells are arranged in an array. The battery cells can be single-sided battery cells or double-sided battery cells. The single-sided battery cell is a battery cell that can receive light from one side only and convert the light into electric power. The double-sided battery cell is a battery cell that can receive light from both sides and convert the light into electric power. The photovoltaic module including double-sided battery cells can not only receive direct sunlight from one side (i.e., the front side) to convert it into electric power, but also receive, from the other side (i.e., the back side), light such as reflected light or scattered light from the ground, thereby improving the power generation efficiency of the photovoltaic module. For example, FIG. 26 shows a cross-sectional view of a double-sided battery cell. As shown in the figure, the double-sided battery cell includes a metal front electrode 141, a front anti-reflection film 142, a boron-doped emission layer 143, an n-type silicon layer 144, a phosphorus-doped back surface field (BSF) layer 145, a back anti-reflection film 146 and a metal back electrode 147. And the battery cell can also have other configurations, without being limited in the present disclosure.

As mentioned above, hot spots that damage the photovoltaic module may occur in the photovoltaic module, and it is necessary to reduce the temperature of the photovoltaic module when hot spots occur, so as to improve the reliability of the photovoltaic module.

A photovoltaic module uses a heat-dissipating aluminum back sheet structure to dissipate heat from the photovoltaic module. However, because the aluminum is opaque, when the photovoltaic module employs double-sided battery cells, the shielding of the aluminum layer will affect the power generation of the double-sided battery cells on its back side in the photovoltaic module.

The photovoltaic module according to at least one embodiment of the present disclosure has a thermally conductive layer in a mesh shape, and the thermally conductive layer is in thermal communication with the battery layer and includes a skeleton section and a hollow section surrounded by the skeleton section. The skeleton section is made of or contains a thermally conductive material. In the thickness direction of the photovoltaic module, at least a part of the skeleton section of the thermally conductive layer overlaps with the gap between adjacent battery cells, and the hollow section of the thermally conductive layer overlaps with the battery cells. That is, at least a part of the skeleton section extends along the gap between adjacent battery cells, and the hollow section is provided at the battery cells. Therefore, on the one hand, heat generated by the battery cells can be conducted along the skeleton section of the thermally conductive layer, and on the other hand, light (such as reflected light and scattered light from the ground) can be allowed to pass through the hollow section of the thermally conductive layer from one side (back side) of the photovoltaic module to the other side (front side) of the photovoltaic module to be received by the back side of the battery cells, thereby reducing the influence on the illumination quantity of the back side of the photovoltaic module. While ensuring the back side power generation of the photovoltaic module which generates power on its both sides, the heat at the hot spot of the photovoltaic module is transferred out in time, and the temperature of the photovoltaic cell where the hot spot is formed is suppressed. Therefore, while ensuring the power generation efficiency of the photovoltaic module, the stability of the photovoltaic module is improved.

It should be noted that the photovoltaic module according to some embodiments of the present disclosure is described by specially taking double-sided battery cells as an example, but the present disclosure is not limited thereto.

Figure 1:
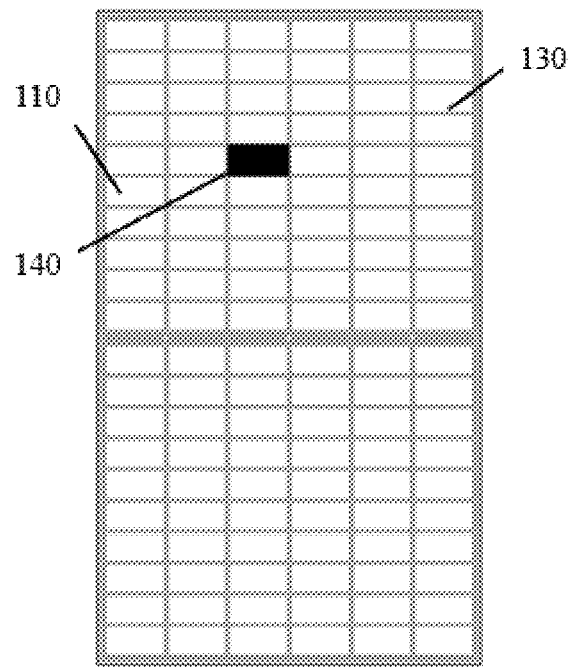
FIG. 1 shows a plan view, of a photovoltaic module according to an embodiment of the present disclosure viewed from one side.
Figure 2:
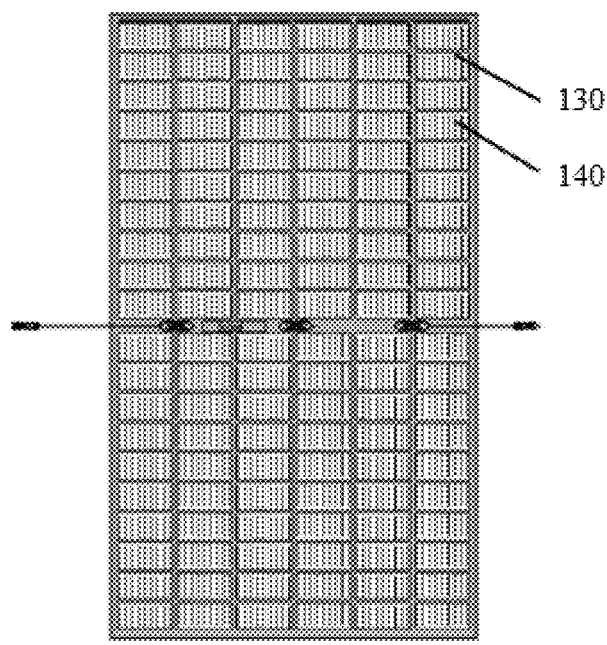
FIG. 2 shows a plan view of the photovoltaic module in FIG. 1 viewed from the other side.
Figure 3:
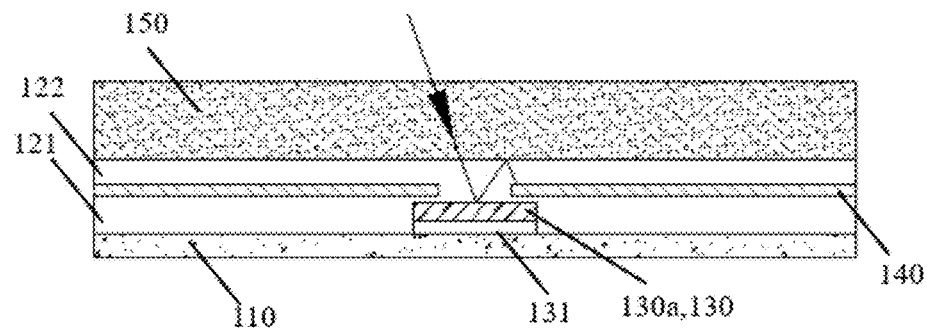
FIG. 3 shows a cross-sectional view of the photovoltaic module in FIG. 1.
Figure 4:
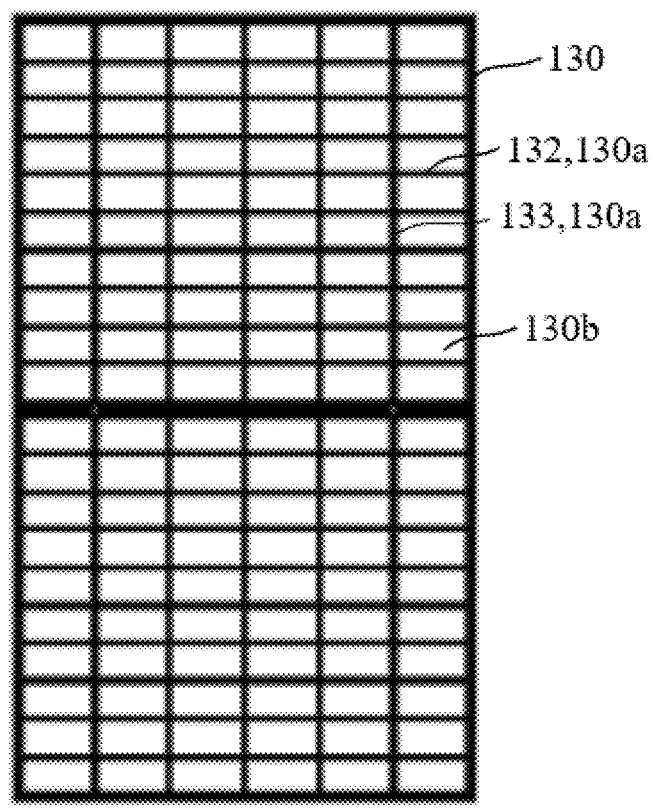
FIG. 4 shows a plan view of a thermally conductive layer of the photovoltaic module in FIG. 1.
Figure 5:
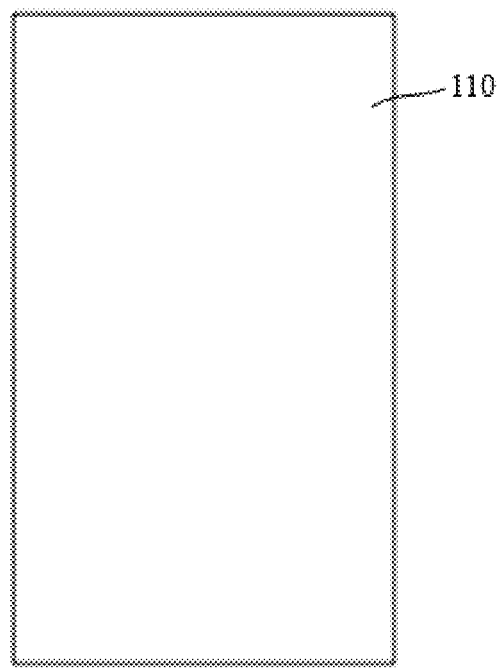
FIG. 5 shows a plan view of a back sheet of the photovoltaic module in FIG. 1.

FIG. 1 shows a plan view of a photovoltaic module according to an embodiment of the present disclosure viewed from one side (front side), FIG. 2 shows a plan view of the photovoltaic module in FIG. 1 viewed from the other side (back side), FIG. 3 shows a cross-sectional view of the photovoltaic module in FIG. 1, FIG. 4 shows a plan view of a thermally conductive layer 130 of the photovoltaic module in FIG. 1, and FIG. 5 shows a plan view of a back sheet 110 of the photovoltaic module in FIG. 1. In FIG. 1, in order to clearly show the back sheet 110 and the thermally conductive layer 130 disposed thereon, only the back sheet 110, the thermally conductive layer 130 and the battery layer 140 are shown (taking one battery cell in the battery layer as an example), and other components are omitted. In FIG. 2, only the battery layer 140 and the thermally conductive layer 130 are shown, and other components are omitted.

As shown in FIGS. 1-5, the photovoltaic module according to an embodiment of the present disclosure includes a back sheet 110, a thermally conductive layer 130 disposed on the back sheet 110, a battery layer 140 including a plurality of battery cells and disposed on the thermally conductive layer 130, and a front sheet 150 covering the battery layer 140. The battery layer 140 is bonded to the front sheet 150 through a second bonding layer 122 and is bonded to the back sheet 110 through a first bonding layer 121, thus the photovoltaic module being packaged. The thermally conductive layer 130 is bonded to the back sheet 110 through a thermally conductive layer bonding layer 131.

For example, the back sheet 110 and the front sheet 150 can be glass plates, etc., or the back sheet 110 can be made of any other material, such as a high molecular polymer material. The high molecular polymer material can form, for example, an insulating barrier layer, a fluorine-containing weather-resistant layer, a third bonding layer or a bonding transition layer, etc. For example, the first bonding layer 121 and the second bonding layer 122 can be EVA (ethylene vinyl acetate) or POE (polyethylene-octene elastomer), etc.

The thermally conductive layer 130 is in a mesh shape, and includes a skeleton section 130a and a hollow section 130b surrounded by the skeleton section 130a, and the skeleton section 130a is formed of or contains a thermally conductive material. As shown in FIG. 3, in the thickness direction of the photovoltaic module, at least a part of the skeleton section 130a overlaps with the gap between the battery cells and covers the edge portions of adjacent battery cells, so as to form thermal communication with the battery cells, while the hollow section 130b overlaps with the battery cells. In an embodiment, the hollow section 130b is filled with the first bonding layer 121.

On the one hand, when hot spots occur, the temperature of the battery cells with hot spots is, for example, above 105 Celsius degrees, while the temperature of the surrounding battery cells is usually, for example, at about 60 Celsius degrees. Due to the existence of temperature gradient, the heat will diffuse from the high temperature zone at the hot spots to the low temperature zone through the skeleton section 130a of the thermally conductive layer 130 in a heat conduction manner, thereby reducing the temperature at the hot spots.

On the other hand, light can pass through the hollow section 130b of the thermally conductive layer 130 and transmit through the photovoltaic module, so as to reduce the influence on the illumination quantity on the back side of the photovoltaic module, thereby ensuring the back side power generation of the photovoltaic module.

In the present embodiment, the skeleton section 130a of the thermally conductive layer 130 includes a plurality of first strip-shaped thermally conductive portions 132 extending in a first direction (up and down directions in FIGS. 1, 2 and 4) and a plurality of second strip-shaped thermally conductive portions 133 extending in a second direction (left and right directions in FIGS. 1, 2 and 4) perpendicular to the first direction, and the first strip-shaped thermally conductive portions 132 and the second strip-shaped thermally conductive portions 133 form a mesh shape. As shown in FIGS. 3-4, in the thickness direction of the photovoltaic module, the first strip-shaped thermally conductive portion 132 or the second strip-shaped thermally conductive portion 133 of the thermally conductive layer 130 overlaps with the gap between adjacent battery cells. That is, the first strip-shaped thermally conductive portion 132 and the second strip-shaped thermally conductive portion 133 are arranged to extend along the gap between adjacent battery cells, while the hollow portion 130b of the thermally conductive layer 130 formed between the first strip-shaped thermally conductive portions 132 and the second strip-shaped thermally conductive portions 133 overlaps with the battery cells in the thickness direction. Therefore, the thermally conductive layer 130 can conduct the heat at the battery cells, and reduce the influence on the light transmission through the photovoltaic module and the influence on the back side power generation efficiency of the photovoltaic module.

As shown in FIG. 3, in the present embodiment, in order to better conduct the heat at the battery cells of the battery layer 140, the first strip-shaped thermally conductive portions 132 and the second strip-shaped thermally conductive portions 133 of the thermally conductive layer 130 can be arranged to overlap with the edges of adjacent battery cells. However, those skilled in the art can understand that in other embodiments, the first strip-shaped thermally conductive portions 132 and the second strip-shaped thermally conductive portions 133 may not overlap with the edges of adjacent battery cells.

In some embodiments, in order to ensure a good heat conduction effect, the thickness of the thermally conductive layer 130 can be in the range of 0.01-1 mm. In addition, the widths of the first strip-shaped thermally conductive portions 132 and the widths of the second strip-shaped thermally conductive portions 133 can be in the range of 5-50 mm.

In addition, the thermally conductive layer 130 is further configured to be capable of reflecting light. Therefore, as shown in FIG. 3, the light incident onto the thermally conductive layer 130 can be reflected and then be incident onto the front side of the battery cells via, for example, the reflection of the back surface of the front sheet 150, thereby enhancing the front side power generation efficiency of the photovoltaic module. For example, the thermally conductive layer 130 is configured to be able to reflect at least 50%, at least 60%, at least 70%, at least 80% or at least 90% of light incident thereon.

For example, the thermally conductive layer 130 can be made of a thermally conductive material, such as aluminum foil, copper foil, etc. In order to enhance the reflective performance of the thermally conductive layer 130, the thermally conductive layer 130 can be plated with tin or nickel.

Figure 6:
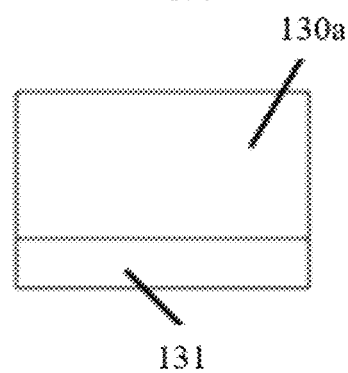
FIG. 6 shows a cross-sectional view of a thermally conductive layer bonding layer and a skeleton section of a thermally conductive layer according to an embodiment of the present disclosure.
Figure 7:
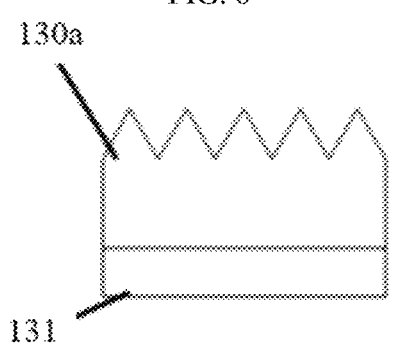
FIG. 7 shows a cross-sectional view of a thermally conductive layer bonding layer and a skeleton section of a thermally conductive layer according to another embodiment of the present disclosure.

FIG. 6 shows a cross-sectional view of the skeleton section 130a of the thermally conductive layer 130 and the thermally conductive layer bonding layer 131 according to an embodiment of the present disclosure. The thermally conductive layer bonding layer 131 is disposed between the back sheet 110 and the thermally conductive layer 130. As shown in FIG. 6, the thermally conductive layer 130 (specifically, the skeleton section 130a thereof) is bonded to the back sheet 110 through the thermally conductive layer bonding layer 131. The surface of the skeleton section 130a of the thermally conductive layer 130 facing the battery layer 140 can be a planar surface. FIG. 7 shows a cross-sectional view of the skeleton section 130a of the thermally conductive layer 130 and the thermally conductive layer bonding layer 131 according to another embodiment of the present disclosure. As shown in FIG. 7, the surface of the skeleton section 130a of the thermally conductive layer 130 facing the battery layer 140 can also be serrated, which serves as a prism to better reflect light to the battery cells of the battery layer 140 and thereby increase the power generation efficiency of the front side of the photovoltaic module.

For example, the thermally conductive layer bonding layer 131 can include EVA, POE, EAA, EEA (ethylene-ethyl acrylate), PP (polypropylene), SIS (styrene-isoprene-styrene), SBS (styrene-butadiene-styrene), etc. For example, the thermally conductive layer bonding layer 131 can be EVA, POE or PP, which can be pressed onto the back sheet 110 at high temperature. Or, the thermally conductive layer bonding layer 131 can be a blend resin of EVA, EAA (ethylene acrylic acid) and SIS, which can be pressed onto the back sheet 110 at high temperature. For example, such thermally conductive layer bonding layer 131 can be hot-pressed together with the first bonding layer 121 and the second bonding layer 122 to form a photovoltaic module.

Or, the thermally conductive layer bonding layer 131 can be a blend resin of EVA, EEA and SBS, which can be pressed onto the back sheet 110 at low temperature or normal temperature. The present disclosure is not limited to these cases.

A manufacturing method for manufacturing, for example, the photovoltaic module as shown in FIG. 3, can include: S11, providing a back sheet; S12, laminating a thermally conductive layer on the back sheet; and S13, laminating a battery layer, which includes a plurality of battery cells, on the thermally conductive layer. The thermally conductive layer is in a mesh shape and includes a skeleton section and a hollow section surrounded by the skeleton section. The plurality of battery cells are arranged in an array. In the thickness direction of the photovoltaic module, at least a part of the skeleton section overlaps with the gap between adjacent battery cells, and the hollow section overlaps with the battery cells.

The thermally conductive layer 130 in the embodiment shown in FIGS. 1-5 can be formed by various ways. In one embodiment, the first strip-shaped thermally conductive portions 132 and the second strip-shaped thermally conductive portions 133 are respectively bonded onto the back sheet 110, so as to form a thermally conductive layer. For example, a rolled strip of aluminum foil can be unfolded and attached to the back sheet 110 to form a first strip-shaped thermally conductive portion 132, and then a rolled strip of aluminum foil can be unfolded and attached to the back sheet 110 to form a second strip-shaped thermally conductive portion 133; the first strip-shaped thermally conductive portion 132 and the second strip-shaped thermally conductive portion 133 intersects with each other to form a mesh pattern, thereby forming a skeleton section 130a of the thermally conductive layer 130, while the section surrounded by the first strip-shaped thermally conductive portion 132 and the second strip-shaped thermally conductive portion 133 forms a hollow section 130b of the thermally conductive layer 130. For example, the first strip-shaped thermally conductive portion 132 and the second strip-shaped thermally conductive portion 133 can have the same width. Therefore, the first strip-shaped thermally conductive portion 132 and the second strip-shaped thermally conductive portion 133 can be formed by using the same rolled strip, thus reducing the cost and facilitating the manufacturing. The first strip-shaped thermally conductive portion 132 and the second strip-shaped thermally conductive portion 133 may have different widths as needed.

In another embodiment, the pattern composed of the skeleton section 130a and the hollow section 130b of the thermally conductive layer 130 can also be formed by stamping a sheet material. However, the present invention is not limited to these cases, and the thermally conductive layer can also be formed on the back sheet 110 by other means such as screen printing, coating, spray coating, sintering, etc.

Figure 8:
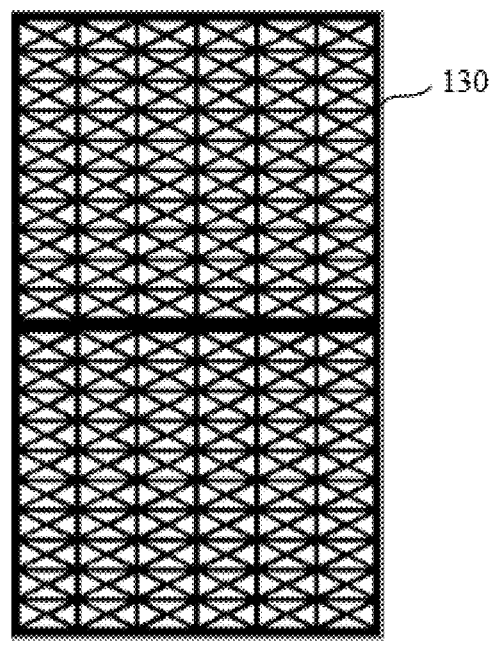
FIG. 8 shows a plan view of a thermally conductive layer according to another embodiment of the present disclosure.
Figure 9:
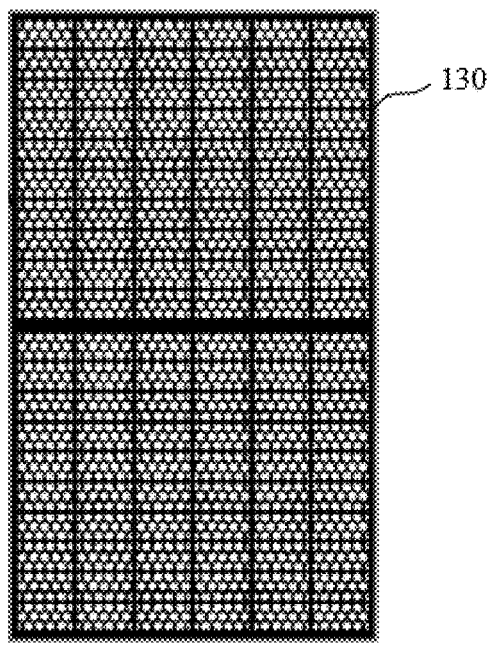
FIG. 9 shows a plan view of a thermally conductive layer according to another embodiment of the present disclosure.
Figure 10:
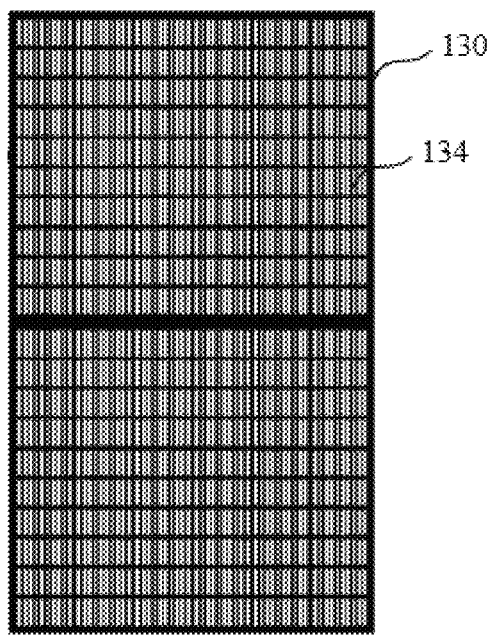
FIG. 10 shows a plan view of a thermally conductive layer according to another embodiment of the present disclosure.

The thermally conductive layer 130 shown in FIG. 4 has a rectangular mesh pattern, but the present disclosure is not limited thereto. FIGS. 8-10 show plan views of the thermally conductive layer 130 according to other embodiments of the present disclosure. As shown in FIG. 8, the thermally conductive layer 130 is in a cross-and-saltire-shaped mesh pattern. As shown in FIG. 9, the thermally conductive layer 130 is in a honeycomb mesh pattern. As shown in FIG. 10, the thermally conductive layer 130 is in a grid-like mesh pattern. In the patterns as shown in FIGS. 8-10, a skeleton section 130a overlapping with the battery cells is added on the basis of the first strip-shaped thermally conductive portions 132 and the second strip-shaped thermally conductive portions 133 as shown in FIG. 4. The rectangular mesh pattern shown in FIG. 4 has less influence on the back side power generation efficiency of the photovoltaic module, while the overlapping area between the thermally conductive layer 130 and the battery cells shown in FIGS. 8-10 is larger, so that the thermally conductive efficiency is higher. The specific pattern of the thermally conductive layer 130 can be designed according to different needs.

The thermally conductive layer 130 shown in FIG. 10 is in a grid-like mesh pattern, the light shielding region where the skeleton section 130a overlaps with the battery cells includes a plurality of sub-strip-shaped thermally conductive portions 134, and the plurality of sub-strip-shaped thermally conductive portions 134 preferably overlap with the main grids of the battery cells. As the plurality of sub-strip-shaped thermally conductive portions 134 overlap with the main grids of the battery cells, they can quickly conduct the heat at the main grid, thereby minimizing the melting phenomenon of solder at the main grids caused by local overheating. Here, the main grid is a bus line connected with the fine grids (e.g., the front electrode and the back electrode of the battery cell) to collect current from the fine grids.

The photovoltaic module can also have other laminated structures.

Figure 11:
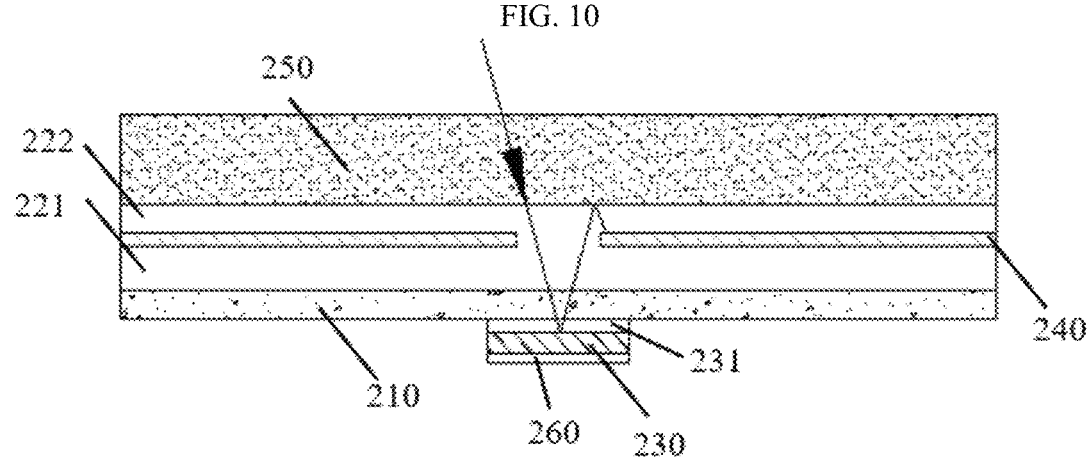
FIG. 11 shows a cross-sectional view of a photovoltaic module according to another embodiment of the present disclosure.

FIG. 11 shows a cross-sectional view of a photovoltaic module according to another embodiment of the present disclosure. As shown in FIG. 11, the photovoltaic module includes a back sheet 210, a first bonding layer 221 disposed on a first surface of the back sheet 210, a battery layer 240 including a plurality of battery cells and disposed on the first bonding layer 221, a second bonding layer 222 covering the battery layer 240, a front sheet 250 disposed on the second bonding layer 222, and a thermally conductive layer 230 disposed on a second surface of the back sheet 210 opposite to the first surface of the back sheet 210. The thermally conductive layer 230 is bonded to the back sheet 210 through a thermally conductive layer bonding layer 231. In order to increase the thermally conductive efficiency of the thermally conductive layer 230, in the thickness direction, the skeleton section of the thermally conductive layer 230 overlaps with the edge of the battery cell adjacent thereto. Optionally, because the thermally conductive layer 230 is exposed to the atmosphere, in order to protect the thermally conductive layer 230, a fluororesin layer 260 serving as a protective layer can be disposed, for example, by spraying, on a side of the thermally conductive layer 230 away from the back sheet 210.

Figure 12:
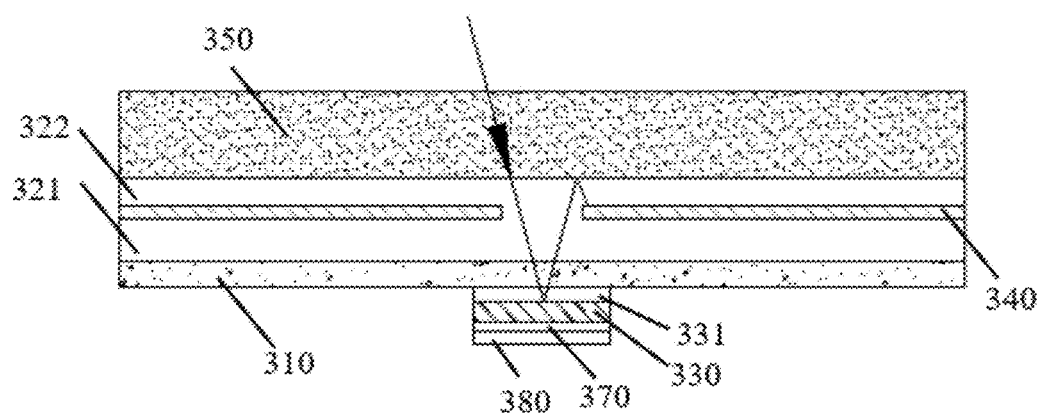
FIG. 12 shows a cross-sectional view of a photovoltaic module according to another embodiment of the present disclosure.

FIG. 12 shows a cross-sectional view of a photovoltaic module according to another embodiment of the present disclosure. As shown in FIG. 12, the photovoltaic module includes a back sheet 310, a first bonding layer 321 disposed on a first surface of the back sheet 310, a battery layer 340 including a plurality of battery cells and disposed on the first bonding layer 321, a second bonding layer 322 covering the battery layer 340, a front sheet 350 disposed on the second bonding layer 322, and a thermally conductive layer 330 disposed on a second surface of the back sheet 310 opposite to the first surface of the back sheet 310. The thermally conductive layer 330 is bonded to the back sheet 310 through a thermally conductive layer bonding layer 331. In order to increase the thermally conductive efficiency of the thermally conductive layer 330, in the thickness direction, the skeleton section of the thermally conductive layer 330 overlaps with the edge of the battery cell adjacent thereto. Different from the photovoltaic module shown in FIG. 11, in order to protect the thermally conductive layer 330, a fluorine-containing weather-resistant layer 380 serving as a protective layer can be disposed on a side of the thermally conductive layer 330 away from the back sheet 310, and the fluorine-containing weather-resistant layer 380 is attached to the thermally conductive layer 330 through a fourth bonding layer 370. For example, the fourth bonding layer 370 can be polyurethane, EVA, POE, PP, or blend resin of EVA, EAA and SIS, or blend resin of EVA, EEA and SBS.

A manufacturing method for manufacturing, for example, the photovoltaic modules as shown in FIG. 11 and FIG. 12 can include: S21, providing a back sheet; S22, laminating a battery layer on a first side of the back sheet; and S23, laminating a thermally conductive layer on a second side of the back sheet opposite to the first side of the back sheet. The battery cells are arranged in an array. The thermally conductive layer is in a mesh shape and includes a skeleton section and a hollow section surrounded by the skeleton section. In the thickness direction of the photovoltaic module, at least a part of the skeleton section overlaps with the gap between adjacent battery cells, and the hollow section overlaps with the battery cells.

FIGS. 13A-21 respectively show cross-sectional views of a back sheet of a photovoltaic module according to another embodiment of the present disclosure. As shown in FIGS. 13A-21, the thermally conductive layer can also be compounded into the back sheet instead of being disposed on the back sheet independently of the back sheet. In the embodiment shown in FIGS. 13A-21, the thermally conductive layer in the back sheet is in a mesh shape, and the battery layer including a plurality of battery cells is disposed on the back sheet. At least a part of the skeleton section of the thermally conductive layer overlaps with the gap between adjacent battery cells and the edge of the battery cell adjacent thereto in the thickness direction, while the hollow section of the thermally conductive layer overlaps with the battery cells in the thickness direction.

Figure 13A:
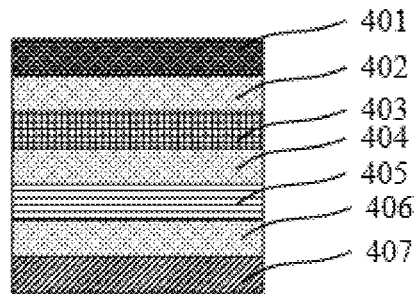
FIGS. 13A-13C show cross-sectional views of a back sheet of a photovoltaic module according to another embodiment of the present disclosure.
Figure 13B:
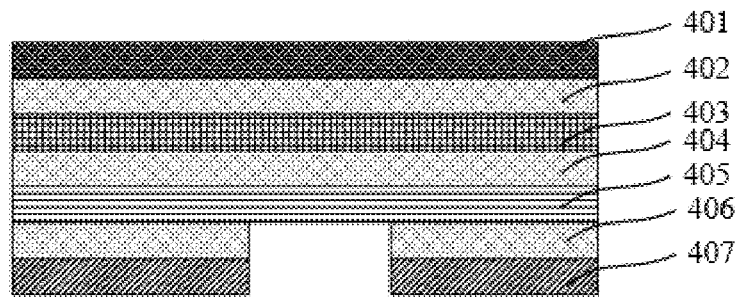
Figure 13C:
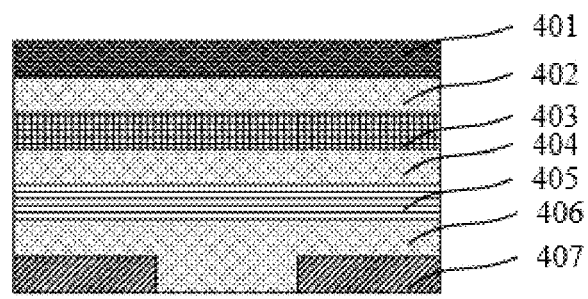

As shown in FIG. 13A, in an example, the back sheet can sequentially include a thermally conductive layer 407, a first third bonding layer 406, a fluorine-containing weather-resistant layer 405, a second third bonding layer 404, an insulating barrier layer 403, a third third bonding layer 402 and a bonding transition layer 401, which are stacked. For example, the battery layer can be attached to the bonding transition layer 401 through a first bonding layer (e.g., the first bonding layer 121 as shown in FIG. 3). The bonding transition layer is disposed at the outermost side of the back sheet, here, at the outer side of the third third bonding layer 402, and this is helpful to enhance the bonding force of the first bonding layer to the back sheet, so that the back sheet and the battery layer are more firmly bonded together. As shown in FIG. 13B and FIG. 13C, because the thermally conductive layer 407 is in a mesh shape and includes a skeleton section and a hollow section, the hollow section can be filled with air (see FIG. 13B) or be filled with the first third bonding layer 406 adjacent thereto (see FIG. 13C).

Figure 14A:
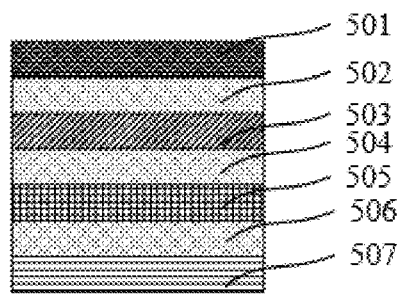
FIGS. 14A-14B show cross-sectional views of a back sheet of a photovoltaic module according to another embodiment of the present disclosure.
Figure 14B:
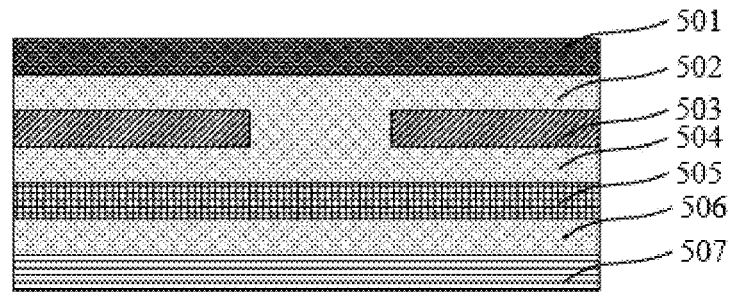

As shown in FIG. 14A, in another example, the back sheet can sequentially include a fluorine-containing weather-resistant layer 507, a first third bonding layer 506, an insulating barrier layer 505, a second third bonding layer 504, a thermally conductive layer 503, a third third bonding layer 502 and a bonding transition layer 501, which are stacked. For example, the battery layer can be attached to the bonding transition layer 501 through a first bonding layer (e.g., the first bonding layer 121 as shown in FIG. 3). As shown in FIG. 14B, because the thermally conductive layer 503 is in a mesh shape and includes a skeleton section and a hollow section, the hollow section can be filled with the third third bonding layer 502 adjacent thereto and/or the second third bonding layer 504 adjacent thereto.

Figure 15:
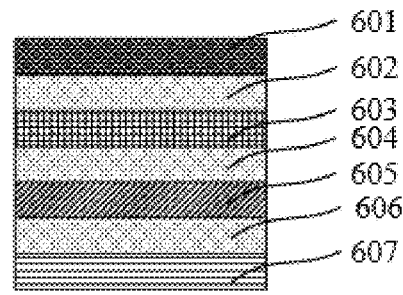
FIG. 15 shows a cross-sectional view of a back sheet of a photovoltaic module according to another embodiment of the present disclosure.

As shown in FIG. 15, in another example, the back sheet can sequentially include a fluorine-containing weather-resistant layer 607, a first third bonding layer 606, a thermally conductive layer 605, a second third bonding layer 604, an insulating barrier layer 603, a third third bonding layer 602 and a bonding transition layer 601, which are stacked. For example, the battery layer can be attached to the bonding transition layer 601 through a first bonding layer (e.g., the first bonding layer 121 as shown in FIG. 3).

Figure 16:
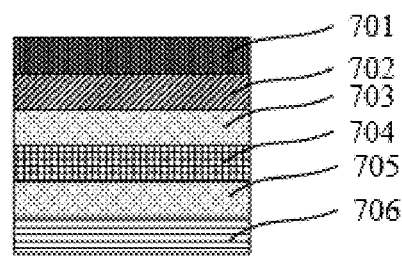
FIG. 16 shows a cross-sectional view of a back sheet of a photovoltaic module according to another embodiment of the present disclosure.

As shown in FIG. 16, in another example, the back sheet can sequentially include a fluorine-containing weather-resistant layer 706, a first third bonding layer 705, an insulating barrier layer 704, a second third bonding layer 703, a thermally conductive layer 702 and a bonding transition layer 701, which are stacked. For example, the battery layer can be attached to the bonding transition layer 701 through a first bonding layer (e.g., the first bonding layer 121 as shown in FIG. 3). The bonding transition layer is disposed at the outermost side of the back sheet, here, at the outer side of the thermally conductive layer 702, and this is helpful to enhance the bonding force of the first bonding layer to the back sheet, so that the back sheet and the battery layer are more firmly bonded together.

Figure 17:
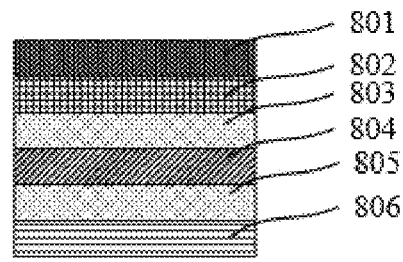
FIG. 17 shows a cross-sectional view of a back sheet of a photovoltaic module according to another embodiment of the present disclosure.

As shown in FIG. 17, in another example, the back sheet can sequentially include a fluorine-containing weather-resistant layer 806, a first third bonding layer 805, a thermally conductive layer 804, a second third bonding layer 803, an insulating barrier layer 802 and a bonding transition layer 801, which are stacked. For example, the battery layer can be attached to the bonding transition layer 801 through a first bonding layer (e.g., the first bonding layer 121 shown in FIG. 3). The bonding transition layer is arranged at the outermost side of the back sheet, here, at the outer side of the insulating barrier layer 802, and this is helpful to enhance the bonding force of the first bonding layer to the back sheet, so that the back sheet and the battery layer are more firmly bonded together.

Figure 18:
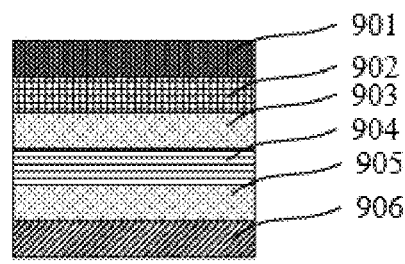
FIG. 18 shows a cross-sectional view of a back sheet of a photovoltaic module according to another embodiment of the present disclosure.

As shown in FIG. 18, in another example, the back sheet can sequentially include a thermally conductive layer 906, a first third bonding layer 905, a fluorine-containing weather-resistant layer 904, a second third bonding layer 903, an insulating barrier layer 902 and a bonding transition layer 901, which are stacked. For example, the battery layer can be attached to the bonding transition layer 901 through a first bonding layer (e.g., the first bonding layer 121 as shown in FIG. 3).

Figure 19:
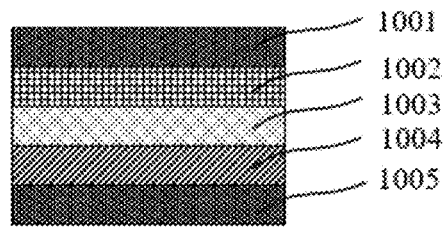
FIG. 19 shows a cross-sectional view of a back sheet of a photovoltaic module according to another embodiment of the present disclosure.

As shown in FIG. 19, in another example, the back sheet can sequentially include a fluorine-containing weather-resistant layer 1005, a thermally conductive layer 1004, a third bonding layer 1003, an insulating barrier layer 1002 and a bonding transition layer 1001, which are stacked. For example, the battery layer can be attached to the bonding transition layer 1001 through a first bonding layer (e.g., the first bonding layer 121 as shown in FIG. 3).

Figure 20:
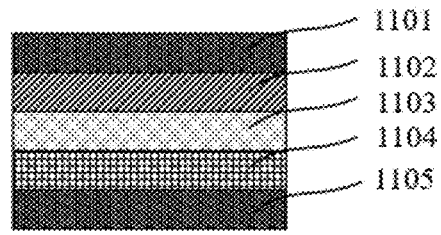
FIG. 20 shows a cross-sectional view of a back sheet of a photovoltaic module according to another embodiment of the present disclosure.

As shown in FIG. 20, in another example, the back sheet can sequentially include a fluorine-containing weather-resistant layer 1105, an insulating barrier layer 1104, a third bonding layer 1103, a thermally conductive layer 1102 and a bonding transition layer 1101, which are stacked. For example, the battery layer can be attached to the bonding transition layer 1101 through a first bonding layer (e.g., the first bonding layer 121 as shown in FIG. 3).

Figure 21:
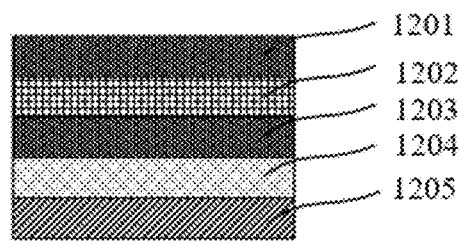
FIG. 21 shows a cross-sectional view of a back sheet of a photovoltaic module according to another embodiment of the present disclosure.

As shown in FIG. 21, in another example, the back sheet can sequentially include a thermally conductive layer 1205, a third bonding layer 1204, a fluorine-containing weather-resistant layer 1203, an insulating barrier layer 1202 and a bonding transition layer 1201, which are stacked. For example, the battery layer can be attached to the bonding transition layer 1201 through a first bonding layer (e.g., the first bonding layer 121 as shown in FIG. 3).

In the examples shown in FIGS. 19-21, the back sheet adopts a five-layer structure. While ensuring other performances of the back sheet, the back sheet has fewer layers and is thin as a whole, and therefore, the thermally conductive layers 1004, 1102 and 1205 can better conduct heat.

For example, the fluorine-containing weather-resistant layer can be a fluorine film, such as PVDF (polyvinylidene fluoride) film, TEDLAR (registered trademark) film (polyvinyl fluoride film), fluorocarbon resin, etc. For example, the third bonding layer in the back sheet can be polyurethane, etc. For example, the insulating barrier layer can be PET (polyethylene terephthalate), etc. For example, the bonding transition layer can be EVA, POE, LDPE (Low Density Polyethylene), PVDF film, TEDLAR film (e.g., as shown in FIGS. 13A-15), or can be fluororesin, such as fluorocarbon resin (e.g., as shown in FIGS. 16-21), etc.

A manufacturing method for manufacturing, for example, the photovoltaic modules as shown in FIG. 13 and FIG. 21 can include: S31, providing a back sheet; and S32, laminating battery cells in an array on the back sheet. The thermally conductive layer is in a mesh shape and includes a skeleton section and a hollow section surrounded by the skeleton section, and in the thickness direction of the photovoltaic module, at least a part of the skeleton section overlaps with the gap between adjacent battery cells, and the hollow section overlaps with the battery cells. The step S31 of providing the back sheet includes, for example, laminating the thermally conductive layer with at least one selected from the group consisting of the insulating barrier layer, the fluorine-containing weather-resistant layer and the bonding transition layer to form the back sheet. According to the present embodiment, the thermally conductive layer can be formed together with the back sheet in the manufacturing process of the back sheet, thus reducing the manufacturing cost.

In the examples as shown in FIGS. 13A-21, the thermally conductive layers 407, 503, 605, 702, 804, 906, 1004, 1102 and 1205 can be aluminum foil. In addition, in the examples shown in FIGS. 13A-21, the thermally conductive layers 407, 503, 605, 702, 804, 906, 1004, 1102 and 1205 can also include a polymeric resin, such as PET, POE, PE, and thermally conductive particles mixed in the polymeric resin, such as copper particles or aluminum particles. In addition, in some examples, in the case where the thermally conductive layers 503, 605, 702, 804, 1004 and 1102 include a polymeric resin and metal thermally conductive particles mixed in the polymeric resin, the thermally conductive layers 503, 605, 702, 804, 1004 and 1102 can be disposed adjacent to the insulating barrier layer having the same polymeric resin (e.g., PET), and be formed together with the insulating barrier layer by co-extrusion. In this way, the third bonding layer between the thermally conductive layer and the insulating barrier layer is omitted, the thickness of the back sheet is reduced, and the forming process of the thermally conductive layer and the back sheet including the thermally conductive layer is simplified.

Figure 23:
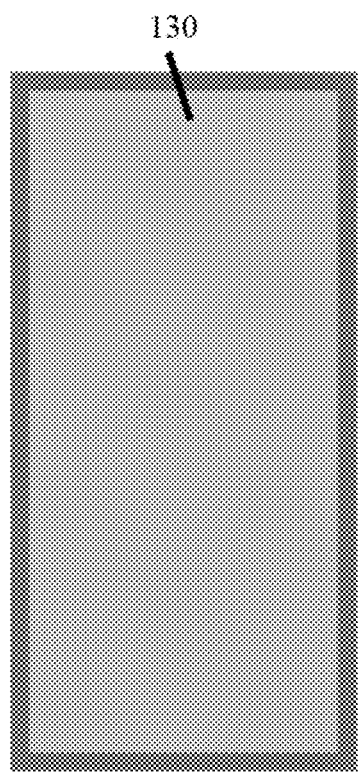
FIG. 23 shows a plan view of a thermally conductive layer in FIG. 22.

It should be understood by those skilled in the art that the structure of the back sheet, such as those shown in FIGS. 13A-21, can also be applied to the thermally conductive layer with other patterns, and are not limited to the thermally conductive layer in the mesh shape, and for example, can be applied to a thermally conductive layer without the hollow section but with a complete surface, such as the thermally conductive layer as shown in FIG. 23 to be described below.

The photovoltaic module according to another embodiment of the present disclosure includes a back sheet, a thermally conductive layer, a battery layer and a front sheet. For example, in an example, similar to the photovoltaic module shown in FIG. 3 (but not including the thermal conductive layer bonding layer 131), the photovoltaic module can include a back sheet, a thermal conductive layer disposed on the back sheet, a battery layer including a plurality of battery cells and disposed on the thermal conductive layer, and a front sheet covering the battery layer. For example, in another example, similar to the photovoltaic modules shown in FIGS. 11-12 (but not including the thermally conductive layer bonding layers 231 and 331) and FIGS. 22 and 24 to be described below, the photovoltaic module can include a back sheet, a battery layer including a plurality of battery cells and disposed on the back sheet, a front sheet covering the battery layer, and a thermally conductive layer disposed on a side of the back sheet away from the battery layer. For example, the thermally conductive layer is in a mesh shape and includes a skeleton section and a hollow section surrounded by the skeleton section, and in the thickness direction of the photovoltaic module, at least a part of the skeleton section overlaps with the gap between adjacent battery cells, and the hollow section overlaps with the battery cells.

In the present embodiment, the thermally conductive layer is a thermally conductive film layer bonded to a surface of the back sheet, and the thermally conductive film layer includes thermally conductive particles and a white inorganic pigment. The thermally conductive particles in the thermally conductive film layer provide the thermally conductive film layer a good thermally conductive characteristic, so as to conduct out the heat of the battery layer at the hot spot in time. The white inorganic pigment in the thermally conductive film layer provides the thermally conductive layer a good reflective characteristic, so as to reflect light incident on the thermally conductive layer to the battery cells, thereby increasing the power generation efficiency of the photovoltaic module.

For example, the thermally conductive particles can include one or more selected from the group consisting of silicon carbide, aluminum nitride and boron carbide. In addition, the thermally conductive particles can also include one or more selected from the group consisting of aluminum particles, silver particles, copper particles and gold particles.

For example, the white inorganic pigment can include one or more selected from the group consisting of lithopone, titanium dioxide, talcum powder, lead white, mica, calcium carbonate, calcium sulfate, zinc oxide, antimony trioxide, magnesium oxide, magnesium carbonate, iron oxide, silicon dioxide, zirconium dioxide, barium sulfate and aluminum oxide.

In addition, the thermally conductive layer can further include a binder, an assistant or a catalyst.

The binder is used to firmly attach the thermally conductive layer to the back sheet, such as a glass back sheet. The binder can include an organic polymer, or a colloid formed from organic salt, inorganic salt or organometallic compound. For example, the organic salt can be an alkoxide of $Ti(OR)_4$ or $Si(OR)_4$, or $Pb(CH3COO)_2$. For example, the inorganic salt can be $Zn(NO_3)_2$ or zirconium oxychloride. For example, the organic polymer can include phenolic resin, urea-formaldehyde resin, epoxy resin, polyvinyl acetate, polyethylene-ethyl vinyl ester, acrylate, polystyrene, alkyd resin, polyurethane, polyisocyanate, acrylate diester, silane, polybenzimidazole, polyimide or butyl rubber.

The assistant is used to improve the stability of the thermally conductive film layer and other characteristics thereof. For example, the assistant can be one or more selected from the group consisting of emulsifier, dispersant, polymerization inhibitor, rheological agent, anti-settling agent, desiccant, anti-scaling agent, anti-shrinkage agent, anti-scratch agent, antioxidant, lubricant, release agent, heat stabilizer, light stabilizer, antistatic agent, anti-wear agent, thickener and defoamer. The catalyst can be one or more selected from the group consisting of inorganic acid, organic acid, alkali, acid salt, basic salt and organic ammonium salt.

The white inorganic pigment and the thermally conductive particles are mixed with reagents and solvents, such as the binder, the assistant and the catalyst, etc., so as to prepare a thermally conductive layer preform. The thermally conductive layer preform is coated on the back sheet by screen printing, roll coating, spray coating, draw coating, spin coating, slit method (a coating method of extruding the solution along the die gap and transferring it to a moving substrate), ultrasonic atomization, or any combination thereof. Then, the thermally conductive layer preform is dried at a suitable temperature to form a back sheet attached with the thermally conductive layer. For example, the drying temperature can be, for example, in the range of 0-800 Celsius degrees, or in the range of 0-60 Celsius degrees. Here, the back sheet can include a glass layer. For example, the solvent can be water, petroleum solvent, benzene solvent, terpene solvent, alcohol solvent, ether solvent, ketone solvent, ester solvent, chlorinated hydrocarbon solvent, nitro hydrocarbon solvent or amine solvent.

The thermally conductive film layer can be attached to the back sheet by coating, so it is convenient to manufacture and low in cost, and the manufacturing process of the thermally conductive layer can be combined into the manufacturing process of the back sheet, thus being convenient for management.

In the above embodiments, the thermally conductive layer is in a mesh shape. In some other embodiments, the photovoltaic module includes a back sheet, a thermally conductive layer, a battery layer and a front sheet, and the thermally conductive layer can be disposed, for example, substantially over the entire surface of the back sheet. Similar to the above embodiments, the thermally conductive layer is a thermally conductive film layer bonded to substantially the entire surface of the back sheet, and the thermally conductive film layer includes thermally conductive particles and a white inorganic pigment. The thermally conductive particles in the thermally conductive film layer provide the thermally conductive film layer a good thermally conductive characteristic, so as to conduct out the heat of the battery layer at the hot spot in time. The white inorganic pigment in the thermally conductive film layer provides the thermally conductive layer a good reflective characteristic, so as to reflect light incident on the thermally conductive layer to the battery cells, thereby increasing the power generation efficiency of the photovoltaic module. Other aspects of the thermally conductive layer can be configured as those in the above embodiments.

Figure 22:
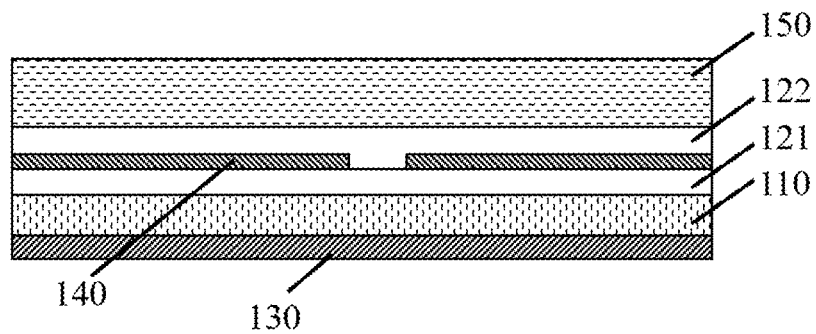
FIG. 22 shows a cross-sectional view of a photovoltaic module according to another embodiment of the present disclosure.

FIG. 22 shows a cross-sectional view of a photovoltaic module according to another embodiment of the present disclosure. As shown in FIG. 22, the photovoltaic module includes a laminated structure and a thermally conductive layer 130. The laminated structure includes a front sheet 150, a first bonding layer 122, a battery layer 140, a second bonding layer 121 and a back sheet 110. The battery layer 140 includes a plurality of battery cells arranged in an array and configured to receive light and generate power. The battery layer 140 is bonded to the front sheet 150 through the first bonding layer 122 and to the back sheet 110 through the second bonding layer 121, and then the laminated structure is formed by laminating the front sheet 150, the first bonding layer 122, the battery layer 140, the second bonding layer 121 and the back sheet 110. The thermally conductive layer 130 is formed on the surface of the back sheet 110 on a side away from the battery layer 140. Therefore, the thermally conductive layer 130 can be formed on the outer surface of the laminated structure after the laminated structure is formed. Therefore, the forming step of the thermally conductive layer 130 can be conveniently and economically combined with the existing manufacturing line. In addition, after the photovoltaic module is put into use, maintenance and service (e.g., repair) of the thermally conductive layer 130 can be convenient.

For example, the front sheet 150 can be a transparent glass plate. The back sheet 110 can be a glass plate, or a composite plate including, for example, an insulating barrier layer, a fluorine-containing weather-resistant layer, a third bonding layer and a bonding transition layer.

A manufacturing method for manufacturing, for example, the photovoltaic module as shown in FIG. 22 can include: providing a transparent front sheet 150; providing a back sheet 110; providing a battery layer 140 between the front sheet 150 and the back sheet 110; laminating a stacked structure which includes the front sheet 150, the battery layer 140 and the back sheet 110, so as to form a laminated structure; and after the laminating, providing a thermally conductive layer 130 on the surface of the back sheet 110 on a side away from the battery layer 140.

Specifically, providing the thermally conductive layer 130 can include coating a thermally conductive layer solution containing thermally conductive particles on the surface of the back sheet 110 on a side away from the battery layer 140; and drying the thermally conductive layer solution to form the thermally conductive layer 130.

For example, the thermally conductive particles can include one or more selected from the group consisting of aluminum particles, silver particles, copper particles and gold particles. These metal particles have good thermal conductivity and are easy to be uniformly coated. In addition, the thermally conductive particles can also include silicon carbide, aluminum nitride, boron carbide, etc.

In the present example, the thermally conductive layer 130 is provided on the surface of the back sheet 110 on a side away from the battery layer 140, and is provided after the laminating. However, it should be understood by those skilled in the art that such method of providing the thermally conductive layer 130 can be applied to the case in which the thermally conductive layer 130 is provided on the surface of the back sheet on a side closer to the battery layer 140, and can be performed before the laminating. In addition, in some other examples, the thermally conductive layer solution can also include the above-mentioned white pigment, etc.

In the present example, the thermally conductive layer solution includes curing component and diluting component. The curing components can include rheological assistant, acrylic resin, amino resin, first solvent, acetate butyrate fiber solution and leveling agent. The diluting component can include second solvent and isocyanate. The rheological assistant has an alignment effect on aluminum particles, and can be, for example, ethylene-vinyl acetate copolymer dispersion or polyolefin anti-settling agent. The first solvent can be, for example, an alcohol ether organic solvent containing hydrophilic groups and lipophilic groups. The second solvent can be aliphatic, ketone, glycol, glycol ether, glycol ester or aromatic hydrocarbon solvent.

For example, the thermally conductive layer solution can be coated on the surface of the back sheet 110 by any one of screen printing, roll coating, spray coating, draw coating, spin coating, slit method, ultrasonic atomization, or any combination thereof.

In addition, the manufacturing method can further include: providing a first bonding layer 122; and providing a second bonding layer 121. And the above laminating step is to laminate a stacked structure including the front sheet 150, the first bonding layer 122, the battery layer 140, the second bonding layer 121 and the back sheet 110 in sequence.

In the present embodiment, the thermally conductive layer solution is directly coated on the laminated structure including the front sheet 150, the back sheet 110 and the battery layer 140, so as to form the thermally conductive layer 130. Therefore, the photovoltaic module with the thermally conductive layer 130 can be formed by directly adding a manufacturing process of the thermally conductive layer 130 to the existing production process, so that the manufacturing process of the thermally conductive layer 130 can be combined with the existing process conveniently and at low cost. In addition, because the thermally conductive layer 130 is directly formed on the laminated structure instead of inside the laminated structure, it is convenient for the long-term maintenance of the photovoltaic module in the later period. Moreover, the thermally conductive layer 130 is formed by coating the thermally conductive layer solution and drying the thermally conductive layer solution, which simplifies the manufacturing and later maintenance of the thermally conductive layer 130 on the laminated structure, and reduces the manufacturing cost of the photovoltaic module.

Figure 24:
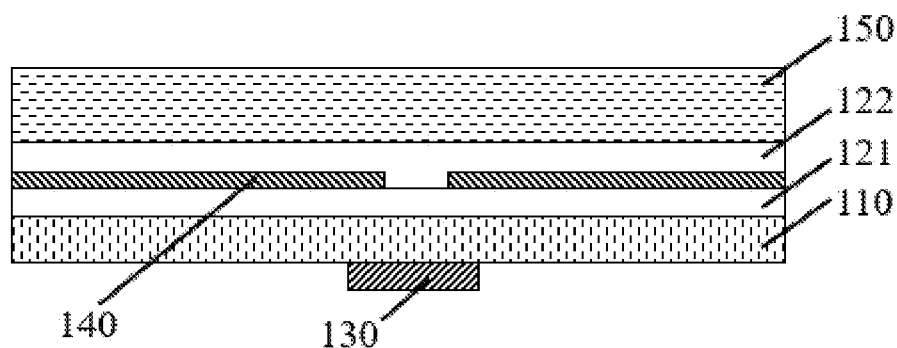
FIG. 24 shows a cross-sectional view of a photovoltaic module according to another embodiment of the present disclosure.

FIG. 23 shows a plan view of the thermally conductive layer 130 in FIG. 22. As shown in FIG. 23, the thermally conductive layer 130 can cover substantially the entire surface of the back sheet 110. However, the pattern of the thermally conductive layer 130 is not limited thereto, and for example, the thermally conductive layer 130 can be in a mesh shape. In the case where the thermally conductive layer 130 is in a mesh shape, the cross-sectional view of the photovoltaic module is, for example, as shown in FIG. 24.

Figure 25:
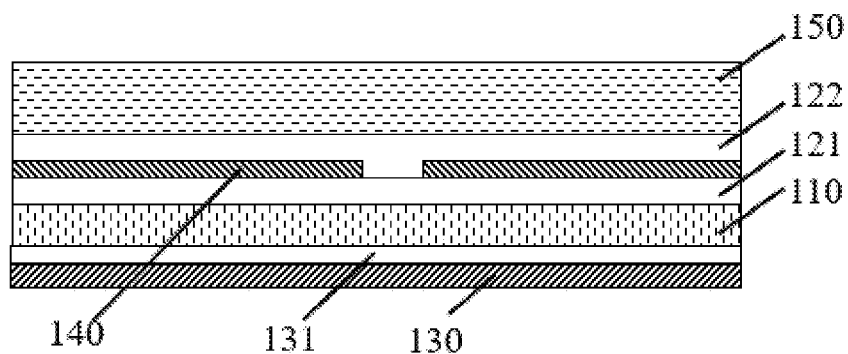
FIG. 25 shows a cross-sectional view of a photovoltaic module according to another embodiment of the present disclosure.

FIG. 25 shows a cross-sectional view of a photovoltaic module according to another embodiment of the present disclosure. As shown in FIG. 25, different from the embodiment shown in FIG. 22, in the present embodiment, the thermally conductive layer 130 is bonded to the surface of the back sheet 110 on a side away from the battery layer 140 through a thermally conductive layer bonding layer 131. As shown in FIG. 25, the photovoltaic module includes a front sheet 150, a first bonding layer 122, a battery layer 140, a second bonding layer 121, a back sheet 110, a thermally conductive layer bonding layer 131 and a thermally conductive layer 130.

Because the thermally conductive layer is formed on the surface of the back sheet 110 on a side away from the battery layer 140, maintenance and service (e.g., repair) of the thermally conductive layer 130 can be convenient after the photovoltaic module is put into use.

The thermally conductive layer 130 can be, for example, a sheet containing thermally conductive particles, such as a foil of aluminum, silver, gold, copper or alloys thereof. In the embodiment shown in FIG. 25, similar to the thermally conductive layer 130 as shown in FIG. 23, the thermally conductive layer 130 can cover substantially the entire surface of the back sheet 110. However, it should be understood by those skilled in the art that the thermally conductive layer 130 can have other patterns.

In an embodiment, a manufacturing method for manufacturing, for example, the photovoltaic module as shown in FIG. 25 can include: providing a transparent front sheet 150; providing a back sheet 110; providing a battery layer 140 between the front sheet 150 and the back sheet 110; laminating a stacked structure which includes the front sheet 150, the battery layer 140 and the back sheet 110, so as to form a laminated structure; and after the laminating, providing a thermally conductive layer 130 on the surface of the back sheet 110 on a side away from the battery layer 140. Specifically, providing the thermally conductive layer includes: bonding the thermally conductive layer 330 to the surface of the back sheet 110 on a side away from the battery layer 140 through the thermally conductive layer bonding layer 131.

For example, here, the thermally conductive layer bonding layer 131 can be epoxy resin, acrylic resin, amino resin or silicone. Such thermally conductive layer bonding layer 131 can bond the thermally conductive layer 130, such as aluminum foil, to the back sheet 110 at normal temperature, which facilitates the formation of the thermally conductive layer 130. In addition, the thermally conductive layer 130 is formed after the laminating, and therefore, the photovoltaic module with the thermally conductive layer 130 can be formed by directly adding a manufacturing process of the thermally conductive layer 130 to the existing production process, so that the manufacturing process of the thermally conductive layer 130 can be combined with the existing process conveniently and at low cost.

In an embodiment, a manufacturing method for manufacturing, for example, the photovoltaic module as shown in FIG. 25 can include: providing a transparent front sheet 150; providing a back sheet 110; providing a battery layer 140 between the front sheet 150 and the back sheet 110; providing a thermally conductive layer 130; providing a thermally conductive layer bonding layer 131 between the thermally conductive layer 130 and the surface of the back sheet 110 away from the battery layer 140; and laminating a stacked structure which sequentially includes the front sheet 150, the battery layer 140, the back sheet 110, the thermally conductive layer bonding layer 131 and the thermally conductive layer 130. Here, in the laminating process, the thermally conductive layer bonding layer 131 is melted due to high temperature, and the thermally conductive layer 130 is bonded to the back sheet 110 by hot melt welding using the thermally conductive layer bonding layer 131. For example, here, the thermally conductive layer bonding layer 131 can be a photovoltaic module packaging film, such as EVA or POE, or any other bonding material, as long as the laminating temperature range of the thermally conductive layer bonding layer 131 is the same as those of the materials of the first bonding layer 122 and the second bonding layer 121 and it is convenient for being laminated together.

In addition, a first bonding layer 122 can be provided between the front sheet 150 and the battery layer 140, and a second bonding layer 121 can be provided between the back sheet 110 and the battery layer 140, and the first bonding layer 122 and the second bonding layer 121 can be laminated simultaneously in the laminating process.

Here, the front sheet 150, the first bonding layer 122, the battery layer 140, the second bonding layer 121, the back sheet 110, the thermally conductive layer bonding layer 3113 and the thermally conductive layer 130 are laminated together at the same time, so as to form a photovoltaic module, and this is helpful to simplify the manufacturing process of the photovoltaic module and reduce the manufacturing cost, and is helpful to economically and conveniently combine the formation of the thermally conductive layer 130 with the existing manufacturing process.

This specification describes at least the following items:

(1) A photovoltaic module, comprising:

a battery layer, wherein the battery layer comprises a plurality of battery cells, and the plurality of battery cells are arranged in an array and configured to receive light and generate power; and a thermally conductive layer, wherein the thermally conductive layer is formed of a thermally conductive material or contains a thermally conductive material, and is in thermal communication with the battery layer, wherein the thermally conductive layer is in a mesh shape and comprises a skeleton section and a hollow section surrounded by the skeleton section; and in a thickness direction of the photovoltaic module, at least a part of the skeleton section overlaps with a gap between adjacent battery cells, and the hollow section overlaps with the plurality of battery cells.

(2) The photovoltaic module according to item (1), further comprising a back sheet, wherein the thermally conductive layer is sandwiched between the back sheet and the battery layer.

(3) The photovoltaic module according to item (1), further comprising a back sheet, wherein the thermally conductive layer is disposed on a side of the back sheet away from the battery layer.

(4) The photovoltaic module according to item (2) or (3), further comprising a thermally conductive layer bonding layer, wherein the thermally conductive layer bonding layer is disposed between the back sheet and the thermally conductive layer so as to bond the thermally conductive layer to the back sheet.

(5) The photovoltaic module according to item (2) or (3), further comprising a first bonding layer, wherein the first bonding layer is disposed between the back sheet and the battery layer so as to bond the battery layer to the back sheet.

(6) The photovoltaic module according to any one of items (1)-(5), wherein the skeleton section of the thermally conductive layer is configured to be capable of reflecting light.

(7) The photovoltaic module according to any one of items (1)-(6), wherein the skeleton section of the thermally conductive layer is aluminum foil or copper foil.

(8) The photovoltaic module according to any one of items (1)-(7), wherein the skeleton section of the thermally conductive layer is plated with tin or nickel.

(9) The photovoltaic module according to any one of items (1)-(8), wherein a surface, facing the battery layer, of the skeleton section of the thermally conductive layer is serrated.

(10) The photovoltaic module according to any one of items (1)-(9), wherein in the thickness direction, the at least a part of the skeleton section overlaps with an edge of the battery cell.

(11) The photovoltaic module according to any one of items (1)-(10), wherein the skeleton section comprises a plurality of first strip-shaped thermally conductive portions extending in a first direction and a plurality of second strip-shaped thermally conductive portions extending in a second direction intersected with the first direction.

(12) The photovoltaic module according to item (11), wherein the first direction is perpendicular to the second direction.

(13) The photovoltaic module according to item (11) or (12), wherein the first strip-shaped thermally conductive portion and the second strip-shaped thermally conductive portion have a same width.

(14) The photovoltaic module according to any one of items (1)-(13), wherein the thermally conductive layer is formed by stamping a sheet material.

(15) The photovoltaic module according to any one of items (1)-(14), wherein the thermally conductive layer is in a grid-like mesh pattern, the skeleton section comprises a plurality of sub-strip-shaped thermally conductive portions overlapped with the battery cells, and the plurality of sub-strip-shaped thermally conductive portions overlap with main grids of the battery cells.

(16) The photovoltaic module according to item (3), further comprising:

a protective layer, wherein the protective layer is disposed on a side of the thermally conductive layer away from the back sheet.

(17) The photovoltaic module according to item (2) or (3), further comprising:

a front sheet, wherein the front sheet is disposed on a side of the battery layer away from the back sheet, and the battery layer is sandwiched between the back sheet and the front sheet.

(18) The photovoltaic module according to item (2) or (3), wherein the thermally conductive layer is a thermally conductive film layer bonded to a surface of the back sheet, and the thermally conductive film layer comprises a thermally conductive particle and a white inorganic pigment.

(19) The photovoltaic module according to item (18), wherein the thermally conductive particle comprises one or more selected from a group consisting of silicon carbide, aluminum nitride and boron carbide.

(20) The photovoltaic module according to item (18), wherein the white inorganic pigment comprises one or more selected from a group consisting of lithopone, titanium dioxide, talcum powder, lead white, mica, calcium carbonate, calcium sulfate, zinc oxide, antimony trioxide, magnesium oxide, magnesium carbonate, iron oxide, silicon dioxide, zirconium dioxide, barium sulfate and aluminum oxide.

(21) The photovoltaic module according to any one of items (2), (3) and (18), wherein the back sheet comprises a glass layer.

(22) The photovoltaic module according to item (2) or (3), wherein the back sheet comprises at least one selected from a group consisting of an insulating barrier layer, a fluorine-containing weather-resistant layer, a third bonding layer and a bonding transition layer.

(23) A back sheet of a photovoltaic module, comprising:

a thermally conductive layer in a mesh shape, wherein the thermally conductive layer comprises a skeleton section and a hollow section surrounded by the skeleton section.

(24) The back sheet according to item (23), further comprising:

a third bonding layer; and at least one selected from a group consisting of an insulating barrier layer, a fluorine-containing weather-resistant layer and a bonding transition layer, wherein the thermally conductive layer is adjacent to at least one of the third bonding layers.

(25) The back sheet according to item (23), further comprising:
a third bonding layer, an insulating barrier layer, a fluorine-containing weather-resistant layer and a bonding transition layer,
wherein the thermally conductive layer is adjacent to at least one of the third bonding layers.

(26) The back sheet according to item (23), wherein
the back sheet comprises five layers and further comprises: a third bonding layer, an insulating barrier layer, a fluorine-containing weather-resistant layer, and a bonding transition layer at outermost; and
the thermally conductive layer is adjacent to at least one of the third bonding layers.

(27) The back sheet according to any one of items (24)-(26), wherein the third bonding layer extends into the hollow section of the thermally conductive layer.

(28) The back sheet according to item (23), wherein
the thermally conductive layer comprises a polymeric resin and thermally conductive particles mixed in the polymeric resin.

(29) The back sheet according to item (28), further comprising:
an insulating barrier layer, wherein
the thermally conductive layer is adjacent to the insulating barrier layer, and the thermally conductive layer and the insulating barrier layer are formed together by co-extrusion.

(30) The back sheet according to item (29), wherein
the insulating barrier layer comprises the polymeric resin, and the polymeric resin is PET.

(31) A photovoltaic module, comprising:
a battery layer, wherein the battery layer comprises a plurality of battery cells arranged in an array; and
the back sheet according to any one of items (23)-(30), wherein the battery layer is bonded to the back sheet through a first bonding layer.

(32) A manufacturing method of a photovoltaic module, comprising:
providing a back sheet;
laminating a thermally conductive layer on the back sheet, wherein the thermally conductive layer is in a mesh shape and comprises a skeleton section and a hollow section surrounded by the skeleton section; and
laminating a battery layer, which comprises a plurality of battery cells, on the thermally conductive layer, wherein the plurality of battery cells are arranged in an array, so that in a thickness direction of the photovoltaic module, at least a part of the skeleton section overlaps with a gap between adjacent battery cells, and the hollow section overlaps with the plurality of battery cells.

(33) The manufacturing method of the photovoltaic module according to item (32), wherein
the thermally conductive layer is a thermally conductive film layer bonded to a surface of the back sheet, and the thermally conductive film layer comprises a thermally conductive particle and a white inorganic pigment, and
laminating the thermally conductive layer on the back sheet comprises:
coating a thermally conductive layer preform, which comprises the thermally conductive particle and the white inorganic pigment, on the surface of the back sheet; and
drying the thermally conductive layer preform to form the thermally conductive film layer.

(34) A manufacturing method of a photovoltaic module, comprising:
providing a back sheet;
laminating a battery layer on a first side of the back sheet, wherein the battery layer comprises a plurality of battery cells, and the plurality of battery cells are arranged in an array; and
laminating a thermally conductive layer on a second side of the back sheet opposite to the first side of the back sheet, wherein the thermally conductive layer is in a mesh shape and comprises a skeleton section and a hollow section surrounded by the skeleton section, and the laminating results in that in a thickness direction of the photovoltaic module, at least a part of the skeleton section overlaps with a gap between adjacent battery cells, and the hollow section overlaps with the plurality of battery cells.

(35) The manufacturing method of the photovoltaic module according to item 34, wherein
the thermally conductive layer is a thermally conductive film layer bonded to a surface of the back sheet, and the thermally conductive film layer comprises a thermally conductive particle and a white inorganic pigment, and
laminating the thermally conductive layer on the second side of the back sheet opposite to the first side of the back sheet comprises:
coating a thermally conductive layer preform, which comprises the thermally conductive particle and the white inorganic pigment, on the surface of the back sheet on the first side of the back sheet; and
drying the thermally conductive layer preform to form the thermally conductive film layer.

(36) A manufacturing method of a photovoltaic module, comprising:
providing the back sheet according to any one of items (23)-(30); and
laminating a battery layer on a bonding layer of the back sheet, wherein the battery layer comprises a plurality of battery cells, the plurality of battery cells are arranged in an array, and the laminating results in that in a thickness direction of the photovoltaic module, at least a part of the skeleton section overlaps with a gap between adjacent battery cells, and the hollow section overlaps with the battery cells.

(37) A manufacturing method of a photovoltaic module, comprising:
providing a transparent front sheet;
providing a back sheet;
providing a battery layer between the front sheet and the back sheet, wherein the battery layer comprises a plurality of battery cells, and the plurality of battery cells are arranged in an array and configured to receive light and generate power; and
providing a thermally conductive layer on a surface of the back sheet on a side away from the battery layer.

(38) The manufacturing method according to item (37), further comprising:
laminating a stacked structure which comprises the front sheet, the battery layer and the back sheet, wherein
after the laminating, the thermally conductive layer is provided.

(39) The manufacturing method according to item (38), wherein
providing the thermally conductive layer comprises:
coating a thermally conductive layer solution containing thermally conductive particles on the surface of the back sheet on a side away from the battery layer; and
drying the thermally conductive layer solution to form the thermally conductive layer on the surface of the back sheet.

(40) The manufacturing method according to item (39), wherein
the thermally conductive layer solution is coated on the surface of the back sheet by any one or a combination of screen printing, roll coating, spray coating, draw coating, spin coating, slit method and ultrasonic atomization.

(41) The manufacturing method according to item (39), wherein
the thermally conductive particles comprise one or more selected from a group consisting of aluminum particles, silver particles, copper particles and gold particles.

(42) The manufacturing method according to item (38), wherein
providing the thermally conductive layer comprises:
bonding the thermally conductive layer to the surface of the back sheet on a side away from the battery layer through a thermally conductive layer bonding layer.

(43) The manufacturing method according to item (42), wherein:
the thermally conductive layer bonding layer is epoxy resin, acrylic resin, amino resin or silicone.

(44) The manufacturing method according to item (37), further comprising:
providing a thermally conductive layer bonding layer between the thermally conductive layer and the surface of the back sheet;
providing a first bonding layer between the front sheet and the battery layer;
providing a second bonding layer between the back sheet and the battery layer;
and
laminating a stacked structure which sequentially comprises the front sheet, the first bonding layer, the battery layer, the second bonding layer, the back sheet, the thermally conductive layer bonding layer and the thermally conductive layer.

(45) The manufacturing method according to item (44), wherein
the thermally conductive layer bonding layer is EVA or POE.

(46) The manufacturing method according to item (44) or (45), wherein
the thermally conductive layer is a sheet containing thermally conductive particles.

(47) The manufacturing method according to any one of items (37)-(46), wherein
the thermally conductive layer is provided so as to comprise a skeleton section and a hollow section surrounded by the skeleton section, and in a thickness direction of the photovoltaic module, at least a part of the skeleton section overlaps with a gap between adjacent battery cells, and the hollow section overlaps with the plurality of battery cells.

(48) The manufacturing method according to item (47), wherein
the thermally conductive layer is provided, so that the at a least part of the skeleton section overlaps with an edge of the battery cell in the thickness direction of the photovoltaic module.

(49) The manufacturing method according to item (47) or (48), wherein
the skeleton section comprises a plurality of first strip-shaped thermally conductive portions extending in a first direction and a plurality of second strip-shaped thermally conductive portions extending in a second direction intersected with the first direction.

(50) The manufacturing method according to any one of items (47)-(49), wherein the thermally conductive layer is provided, so that the skeleton section comprises a plurality of sub-strip-shaped thermally conductive portions overlapped with the battery cells, and the plurality of sub-strip-shaped thermally conductive portions overlap with main grids of the battery cells.

(51) A photovoltaic module, manufactured by the manufacturing method according to any one of items (37)-(50).

The scope of the present disclosure is not defined by the embodiments described above, but be determined by the appended claims and equivalents thereof.

What is claimed is:
1. A back sheet of a photovoltaic module, comprising:
a thermally conductive layer in a mesh shape and an insulating barrier layer,
wherein the thermally conductive layer comprises a skeleton section and a hollow section surrounded by the skeleton section,
wherein the thermally conductive layer is in a grid-like mesh pattern, the skeleton section comprises a plurality of sub-strip-shaped thermally conductive portions overlapped with battery cells, and the plurality of sub-strip-shaped thermally conductive portions overlap with main grids of the battery cells,
wherein the skeleton section further comprises a plurality of first strip-shaped thermally conductive portions extending in a first direction and a plurality of second strip-shaped thermally conductive portions extending in a second direction intersected with the first direction,
wherein at least part of the first strip-shaped thermally conductive portions and at least part of the second strip-shaped thermally conductive portions overlap with the gap between adjacent battery cells,
wherein the sub-strip-shaped thermally conductive portions extend in the second direction and space apart from the second strip-shaped thermally conductive portions in the first direction,
wherein the thickness of the thermally conductive layer is in the range of 0.01-1 mm, and
wherein the widths of the first strip-shaped thermally conductive portions and the widths of the second strip-shaped thermally conductive portions are in the range of 5-50 mm respectively,
wherein the thermally conductive layer comprises a polymeric resin and thermally conductive particles mixed in the polymeric resin,
wherein the thermally conductive layer is adjacent to the insulating barrier layer, and the thermally conductive layer and the insulating barrier layer are formed together by co-extrusion.

2. The back sheet according to claim 1, further comprising:
a bonding layer; and
at least one selected from a group consisting of an a fluorine-containing weather-resistant layer and a bonding transition layer,
wherein the thermally conductive layer is adjacent to the bonding layer.

3. The back sheet according to claim 1, further comprising:
a bonding layer, a fluorine-containing weather-resistant layer and a bonding transition layer,
wherein the thermally conductive layer is adjacent to the bonding layer.

4. The back sheet according to claim 1, comprising five layers, wherein the five layers comprise: the thermally conductive layer, a bonding layer, a fluorine-containing weather-resistant layer, and a bonding transition layer at outermost; and the thermally conductive layer is adjacent to the bonding layer.

* * * * *